(12) United States Patent
Suehiro

(10) Patent No.: US 7,500,308 B2
(45) Date of Patent: Mar. 10, 2009

(54) METHOD OF DETACHING ELECTRONIC COMPONENT FROM PRINTED CIRCUIT BOARD

(75) Inventor: Mitsuo Suehiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 27 days.

(21) Appl. No.: 10/345,351

(22) Filed: Jan. 16, 2003

(65) Prior Publication Data

US 2003/0173109 A1 Sep. 18, 2003

Related U.S. Application Data

(62) Division of application No. 09/536,993, filed on Mar. 29, 2000, now Pat. No. 6,670,556.

(30) Foreign Application Priority Data

Sep. 1, 1999 (JP) ................. 11-247121

(51) Int. Cl.
*H05K 3/34* (2006.01)
(52) U.S. Cl. ............. 29/840; 29/842; 257/778
(58) Field of Classification Search ............ 29/832, 29/840, 841, 835, 846, 847, 762, 426; 174/260, 174/261, 262; 361/760; 257/737, 738, 778
See application file for complete search history.

(56) References Cited

U.S. PATENT DOCUMENTS

| | | | | |
|---|---|---|---|---|
| 5,494,856 | A | * | 2/1996 | Beaumont et al. ............. 438/15 |
| 5,655,704 | A | * | 8/1997 | Sakemi et al. ................ 228/246 |
| 5,859,470 | A | * | 1/1999 | Ellerson et al. ............. 257/772 |
| 5,927,591 | A | * | 7/1999 | Goins et al. ................... 29/760 |
| 5,942,078 | A | * | 8/1999 | Abrahamson ............... 156/378 |
| 6,230,397 | B1 | * | 5/2001 | Tighe .......................... 29/830 |
| 6,365,977 | B1 | * | 4/2002 | Edwards et al. ............. 257/780 |

(Continued)

FOREIGN PATENT DOCUMENTS

JP 8-236924 9/1996

(Continued)

OTHER PUBLICATIONS

Office Action from the Japanese Patent Office in the corresponding Japanese patent application dated Aug. 1, 2006.

*Primary Examiner*—Minh Trinh
(74) *Attorney, Agent, or Firm*—Westerman, Hattori, Daniels & Adrian, LLP.

(57) ABSTRACT

A printed circuit board unit includes an insulated film disposed between a printed circuit board and an electronic component so as to define a through hole. The through hole may be designed to form a constriction in a solder bump. The solder bump is received on an input/output pad located on the printed circuit board. When the electronic component is detached from the printed circuit board, the insulated film is slid along the surface of the printed circuit board while the solder bump is kept at a melting temperature. The sliding movement of the insulated film serves to completely wipe out the melted solder bump from the input/output pad. When the electronic component is thereafter lifted up, the electronic component holding the solder bump can be detached from the printed circuit board. The solder hardly remains on the input/output pad.

2 Claims, 8 Drawing Sheets

U.S. PATENT DOCUMENTS

| | | | |
|---|---|---|---|
| 6,412,685 B2 * | 7/2002 | Hertz et al. | 228/246 |
| 6,429,516 B1 * | 8/2002 | Tsunoi | 29/840 |
| 6,670,556 B1 * | 12/2003 | Suehiro | 174/260 |

FOREIGN PATENT DOCUMENTS

| | | | |
|---|---|---|---|
| JP | 9-246714 | | 9/1997 |
| JP | 9-307214 | * | 11/1997 |
| JP | 11-26929 | | 1/1999 |
| JP | 11-31877 | | 2/1999 |
| JP | 11-68302 | | 3/1999 |
| JP | 11-87906 | | 3/1999 |
| JP | 10-270838 | * | 10/2005 |

* cited by examiner

METHOD OF DETACHING ELECTRONIC COMPONENT FROM PRINTED CIRCUIT BOARD

This application is a Divisional of prior application Ser. No. 09/536,993 filed Mar. 29, 2000 now U.S. Pat. No. 6,670,556.

BACKGROUND OF THE INVENTION

1. Field of the Invention

The present invention relates to a printed circuit board unit comprising a printed circuit board and an electronic component such as a chip mounted on the surface of the printed circuit board through solders.

2. Description of the Prior Art

Soldering is often employed to mount electronic components such as semiconductor devices or bare chips on a printed circuit board in a multi-chip module (MCM) or a semiconductor package. Soldering is also employed to mount electronic components such as the MCMs on a printed circuit board of a larger size, namely, a motherboard. When the individual bare chip or MCM is to be exchanged in the MCM or motherboard, solders must be broken or removed to release bonding between input/output terminals on the bare chip or the MCM and input/output pads arranged on the printed circuit board. For example, an exchanging operation is designed to detach the older bare chip or MCM from the printed circuit board when the solders are subjected to heat of temperature higher than the melting point of the solders. A new bare chip or MCM is thereafter mounted on the printed circuit board by soldering input/output terminals of the new bare chip or MCM to the input/output pads which have previously received the input/output terminals of the old bare chip or MCM.

It is well known that part of the old solder still remains on the input/output pad on the printed circuit board even after the old bare chip or MCM is detached in the above-described exchanging operation. When a new bare chip or MCM is mounted on the printed circuit board, a new solder of a predetermined amount is added to the old solder remaining on the input/output pad. An excessive solder may induce a short between the adjacent input/output terminals.

In particular, the respective input/output pads are not expected to keep solders of a uniform amount remaining thereon. When a bare chip or MCM employs a plurality of input/output terminals such as a ball grid array (BGA) and a pin grid array (PGA), the bare chip or MCM may suffer from the solders of a varied height on the input/output pads. The input/output terminals of the new bare chip or MCM may in part fail to touch the surface of the input/output pads on the printed circuit board. No electric connection can thus be achieved partly.

In view of the above inconvenience, the solders remaining on the input/output pads should be wiped out before a new bare chip or MCM is mounted. For example, the printed circuit board along with the remaining bare chips or MCMs is subjected to another heat so as to melt the solders remaining on the input/output pads. Heat is sometimes repeatedly applied to the printed circuit board more than twice until the solders are completely wiped out. Repeated application of heat is supposed to damage and shorten the life of the printed circuit board, and bare chips or MCMs remaining on the printed circuit board. It sometimes deteriorates the wetness of the input/output pads to solders.

SUMMARY OF THE INVENTION

It is accordingly an object of the present invention to provide a printed circuit board capable of avoiding repeated application of heat even when an electronic component is exchanged.

According to the present invention, there is provided a printed circuit board unit comprising: a printed circuit board; an electronic component; a solder bump interposed between the printed circuit board and the electronic component so as to fix the electronic component to the printed circuit board; and an insulated film disposed between the printed circuit board and the electronic component so as to define a through hole for receiving the solder bump.

With the above structure, electric connection can reliably be established between the printed circuit board and the electronic component since the solder bump is allowed to penetrate through the through hole in the insulated film disposed between the printed circuit board and the electronic component. The insulated film is highly expected to contribute to detachment of the electronic component from the printed circuit board.

For example, the through hole may be designed to form a constriction in the solder bump between the printed circuit board and the electronic component. When the insulated film is brought away from the printed circuit board, the insulated film serves to tear the solder bump in two pieces at the constriction, so that the electronic component can easily be detached from the printed circuit board.

In this case, the insulated film is preferably superposed on the printed circuit board so as to form the constriction right on a conductive pad on the printed circuit board. Such constriction serves to allow the solder bump of a constant amount to remain on the conductive pad, so that a plurality of solder bumps of a uniform amount are allowed to remain on the corresponding conductive pads. The thinner the insulated film gets, the less the solder bump remains on the conductive pad.

Such a through hole, standing on the conductive pad so as to form the constriction in the solder bump, may have the inner peripheral size smaller than the outer peripheral size of the conductive pad. Such a through hole may serve to prevent the melting solder bump from flowing off the periphery of the surface of the conductive pad. In general, the conductive pad usually comprises a base conductive layer on a substrate of the printed circuit board, and a surface conductive layer superposed on the top surface of the base conductive layer. The surface conductive layer is designed to have a corrosion resistance higher than the base conductive layer. If the solder bump is prevented from flowing around the surface conductive layer so as to reach the base conductive layer in the above manner, it is possible to reliably avoid erosion of the base conductive layer such as a copper layer. The base conductive layer is prevented from getting thinner or smaller. The surface conductive layer may be a nickel layer.

When the electronic component is to be detached from the printed circuit board, the through hole may be displaced along the surface of the conductive pad. The solder bump should be kept at a melting temperature. The sliding movement of the insulated film along the surface of the printed circuit board serves to completely wipe out the melting solder bump from the conductive pad. The solder bump is torn apart. Moreover, the solder bump hardly remains on the surface of the conductive pad.

Furthermore, the inner surface of the through hole may be covered with a coating wet to the solder bump. In detaching the electronic component from the printed circuit board in this case, a relative movement may be caused between the conductive pad and the through hole while the solder bump is kept at a melting temperature. When the inner surface of the through hole moves across the solder bump, the melting solder bump is dragged by the coating having a higher wetness to the solder bump. The solder bump can be removed.

Furthermore, the thickness of the insulated film may be designed to correspond to the height of the solder bump on the printed circuit board. Such an insulated film serves to surround the solder bump, received on the conductive pad, within the inner wall of the through hole. In detaching the electronic component from the printed circuit board, a relative movement may be caused between the conductive pad and the through hole while the solder bump is kept at a melting temperature. The inner wall of the through hole is designed to completely wipe out the solder bump from the conductive pad. Moreover, the solder bump hardly remains on the surface of the conductive pad.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
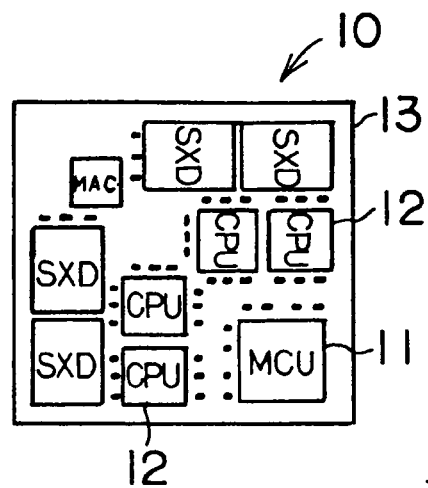
FIG. 1 is a plan view schematically illustrating a multi-chip module (MCM) according to a first embodiment of the present invention.

FIG. 1 illustrates a multi-chip module (MCM) as a printed circuit board unit according to a first embodiment of the present invention. The MCM 10 comprises a printed circuit board 13, and a plurality of semiconductor devices or bare chips, such as a micro controller unit (MCU) 11 and central processing units (CPUs) 12, mounted on the printed circuit board 13. A conductive pattern or printed circuit pattern, not shown, is formed on the printed circuit board 13 so as to electrically connect the MCU 11 and the CPUs 12, for example. The conductive pattern may spread over the surface of the printed circuit board 13, or interposed between layers of insulator sequentially superposed to form the substrate of the printed circuit board 13.

Figure 2:
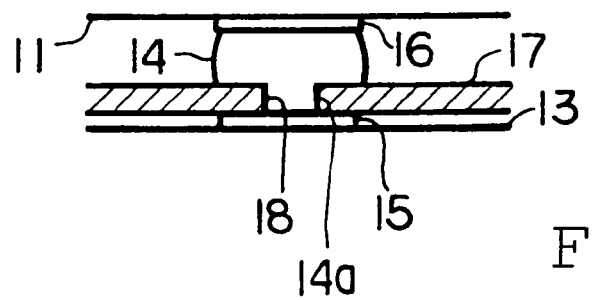
FIG. 2 is an enlarged partial sectional view of the MCM for illustrating the structure of a solder bump.

As is apparent from FIG. 2, a conductive pad or input/output pad 15 is formed on the surface of the printed circuit board 13 so as to receive a solder bump 14. The input/output pad 15 may be integral to the aforementioned conductive pattern over the surface of the printed circuit board 13. Otherwise, the input/output pad 15 may be connected to the aforementioned conductive pattern by a conductive via, for example. The solder bump 14 is designed to receive an input/output terminal or terminal pad 16 arranged on the rear surface of the MCU 11. The solder bump 14 serves to fix or bond the MCU 11 on the printed circuit board 13.

An insulated film 17 is disposed between the surface of the printed circuit board 13 and the MCU 11. The insulated film 17 may be made from polyimide, for example. The thickness of the insulated film 17 is set in a range of 5-10 μm while the solder bump 14 has a height of approximately 70 μm. Such height can be measured in the vertical direction upright to the surface of the printed circuit board 13. The insulated film 17 is superposed on the surface of the input/output pad 15. A through hole 18 is defined or provided in the insulated film 17 so as to receive the solder bump 14. The through hole 18 is designed to define or form a constriction 14a in the solder bump 14 between the MCU 11 and the printed circuit board 13 since the inner peripheral size or inner diameter of the through hole 18 is set smaller than the outer peripheral size or outer diameter of the solder bump 14.

Figure 3:
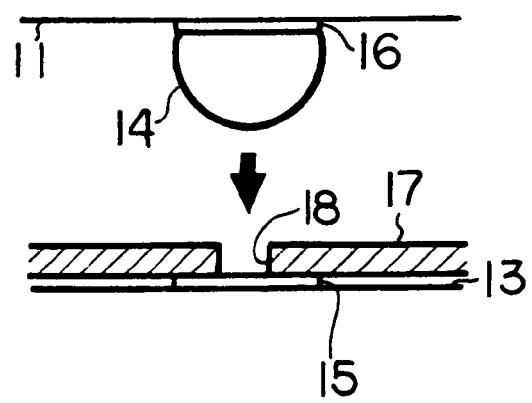
FIG. 3 is an enlarged partial sectional view of the MCM for illustrating a method of mounting the MCU on the printed circuit board.

When the MCU 11 is mounted on the printed circuit board 13 in the MCM 10, the insulated film 17 is first superposed on the surface of the printed circuit board 13, as shown in FIG. 3. The input/output pads 15 are exposed at the surface of the printed circuit board 13. The through holes 18 have previously been formed in the insulated film 17. An excimer laser may be employed to bore the insulated film 17, for example. The position of the through holes 18 is set to correspond to arrangement of the input/output pads 15. When the insulated film 17 is superposed on the printed circuit board 13, the through hole 18 is designed to define a column space standing upright on the surface of the input/output pad 15, as is apparent from FIG. 3.

Figure 4:
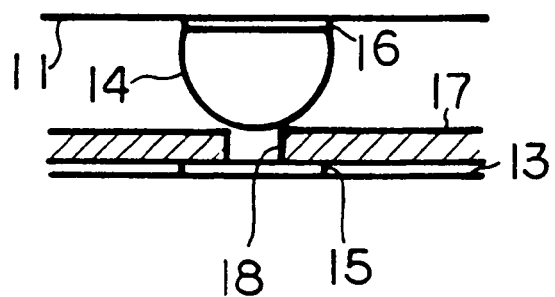
FIG. 4 is an enlarged partial sectional view of the MCM for illustrating the method of mounting the MCU on the printed circuit board.

The MCU 11 is thereafter set on the surface of the insulated film 17. The MCU 11 has previously been provided with solder bumps 14 on the respective terminal pads 16. When the terminal pads 16 on the rear surface of the MCU 11 is aligned with the corresponding input/output pads 15 on the printed circuit board 13, the solder bumps 14 are adapted to close the upper openings of the corresponding through holes 18, respectively, as shown in FIG. 4. After the MCU 11 has been set on the printed circuit board 13 in this manner, the printed circuit board 13 is introduced in a furnace for a heat treatment. The solder bumps 14 melt under the atmosphere of a melting temperature to thereby flow into the corresponding through holes 18. When the printed circuit board 13 is taken out of the furnace and cooled, the solder bumps 14 get hardened on the surface of the input/output pads 15, as shown in FIG. 2.

Figure 5:
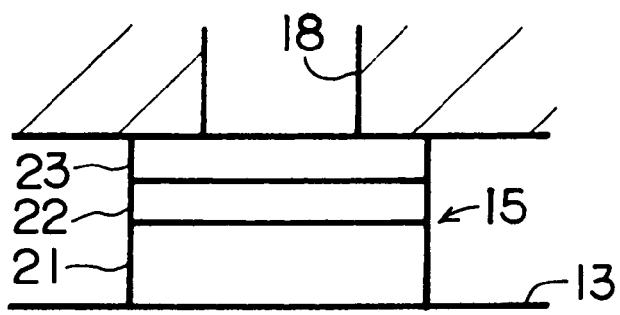
FIG. 5 is an enlarged sectional view illustrating the structure of an input/output pad on the printed circuit board.

The input/output pad 15 comprises, for example, a circular copper layer 21 on the surface of the synthetic resin or ceramic substrate, a circular nickel layer 22 superposed on the top surface of the copper layer 21, and a gold layer 23 superposed on the top surface of the nickel layer 22, as shown in FIG. 5. If a solder containing tin contacts the copper layer 21, a higher temperature of the heat treatment may induce absorption of the copper layer 21 into the solder. The nickel layer 22 serves prevent such erosion of the copper layer 21. If the inner peripheral size or inner diameter of the through hole 18 is set smaller than the outer peripheral size or outer diameter of the surface of the input/output pad 15 in the above-described manner, the through hole 18 serves to reliably prevent the melting solder bump 14 from reaching the copper layer 21 by flowing around-the nickel layer 22. The copper layer 21 can reliably be prevented from erosion and getting thinner or smaller.

When any defect of the MCU 11 is found in the MCM 10, the MCU 11 is preferably replaced with a new MCU 11. When the version of an installed software should be updated, the MCU 11 of the old version may be replaced with an MCU 11 of the new version. In any event, such exchange of the individual MCUs 11 may contribute to reuse of the printed circuit board 13 and the remaining electronic components such as the CPUs 12 mounted on the printed circuit board 13.

Figure 6:
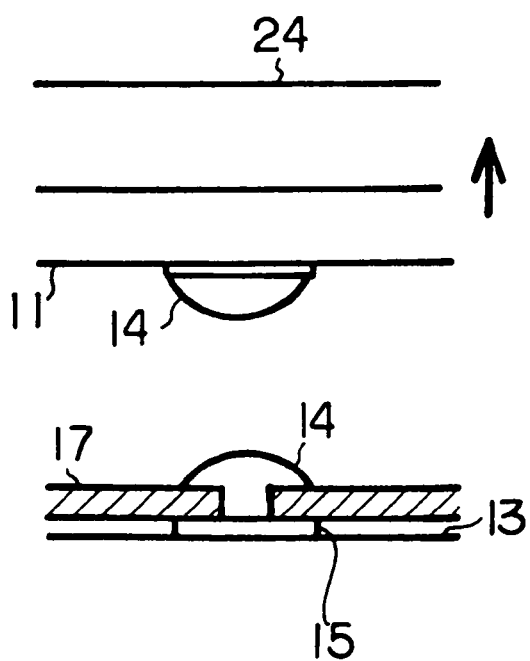
FIG. 6 is an enlarged partial sectional view of the MCM of the first embodiment for illustrating a method of detaching the MCU from the printed circuit board according to a specific example.

When the MCU 11 is to be exchanged, the old MCU 11 is first detached from the printed circuit board 13. In detachment, a heat block 24 is first allowed to contact the MCU 11, as shown in FIG. 6, for example. The MCU 11 is supposed to transmit heat from the heat block 24 to the solder bump 14. The solder bump 14 is caused to melt. The MCU 11 is then lifted above the printed circuit board 13, so that the solder bump 14 is torn between the input/output pad 15 and the terminal pad 16. The bonding can be released in this manner between the MCU 11 and the printed circuit board 13.

Figure 7:
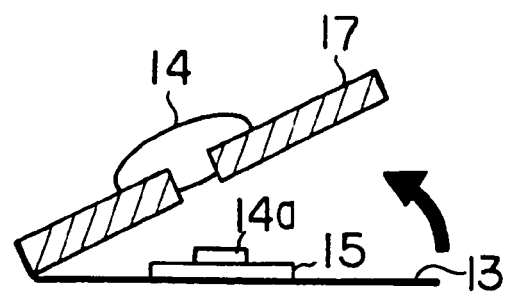
FIG. 7 is an enlarged partial sectional view of the MCM of the first embodiment for illustrating a subsequent method of detaching the MCU from the printed circuit board according to the specific example.

When the MCU 11 has been lifted, the solder bump 14 sometimes can completely be removed from the input/output pad 15 on the printed circuit board 13. Part of the solder bump 14 may sometimes remain on the input/output pad 15. When the insulated film 17 is then lifted and brought away from the printed circuit board 13, as shown in FIG. 7, the solder bump 14 is further torn in two pieces at the constriction 14a. The constriction 14a is only allowed to remain on the input/output pad 15. The solder bumps 14 of a uniform amount are expected to remain on the respective input/output pads 15.

After the solder bumps 14 are removed in the aforementioned manner, the input/output pads 15 are allowed to receive solder bumps 14 of a new MCU 11. Since the old solder bumps 14 of a uniform amount remain, all of the solder bumps 14 of the new MCU 11 are expected to contact the corresponding input/output pads 15. All signal paths corresponding to the respective solder bumps 14 are reliably established between the conductive pattern on the printed circuit board 13 and the MCU 11.

It should be noted that the MCU 11 may be detached from the printed circuit board 13 at the same time when the insulated film 17is detached from the input/output pads 15. In addition, the insulated film 17 may be detached from the input/output pads 15, while the solder bumps 14 are kept melting, or after the solder bumps 14 get hardened.

Figure 8:
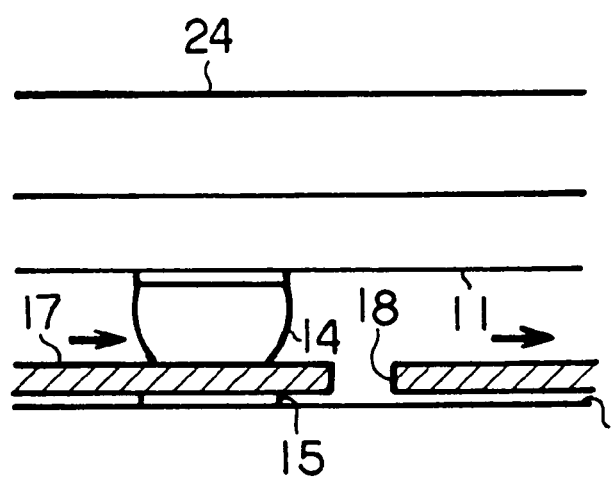
FIG. 8 is an enlarged partial sectional view of the MCM of the first embodiment for illustrating a method of detaching the MCU from the printed circuit board according to another specific example.
Figure 9:
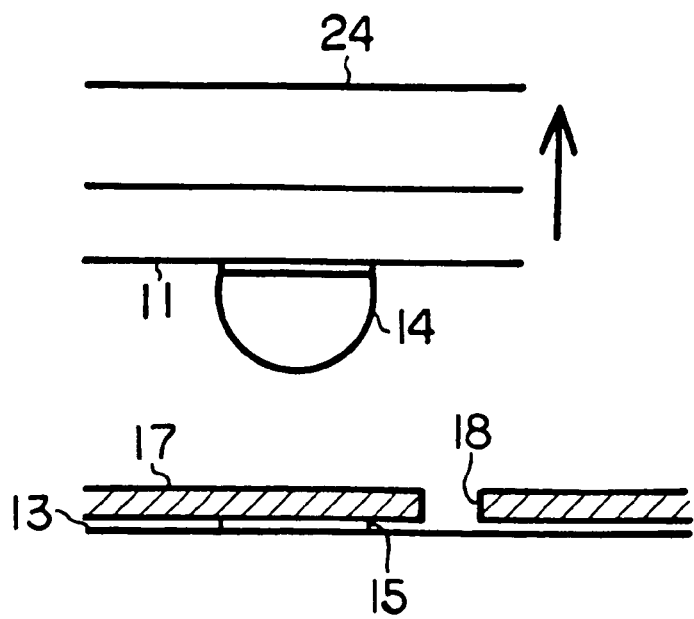
FIG. 9 is an enlarged partial sectional view of the MCM of the first embodiment for illustrating a subsequent method of detaching the MCU from the printed circuit board according to the another specific example.

Alternatively, when the MCU 11 is detached from the printed circuit board 13 in the MCM 10, as shown in FIG. 8, the through hole 18 may be displaced along the surface of the input/output pad 15 while the solder bump 14 is kept at a melting temperature, for example. The sliding movement of the insulated film 17 along the surface of the printed circuit board 13, keeping contact of the heat block 24 with the MCU 11, serves to completely wipe out the melting solder bump 14 from the input/output pad 15. When the MCU 11 is thereafter lifted up, as shown in FIG. 9, the MCU 11 holding the solder bump 14 can be detached from the printed circuit board 13. The solder bump 14 hardly remains on the input/output pad 15.

Figure 10:
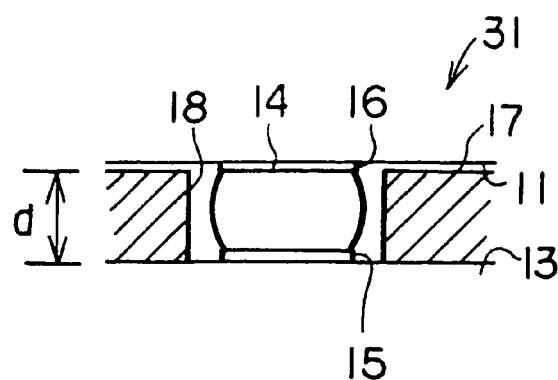
FIG. 10 is an enlarged sectional view schematically illustrating a part of an MCM according to a second embodiment of the present invention.

FIG. 10 illustrates a part of an MCM 31 according to a second embodiment of the present invention. As is apparent from FIG. 10, the thickness d of the insulated film 17 is set to correspond to the height of the solder bump 14 in this embodiment. In addition, the solder bump 14 is surrounded by the inner surface or wall of the through hole 18 since the inner peripheral size or inner diameter of the through hole 18 is set larger than the outer peripheral size or outer diameter of the solder bump 14. It should be noted that the like reference numerals are attached to structure or components achieving the function or advantages identical to those in the above-described first embodiment.

Figure 11:
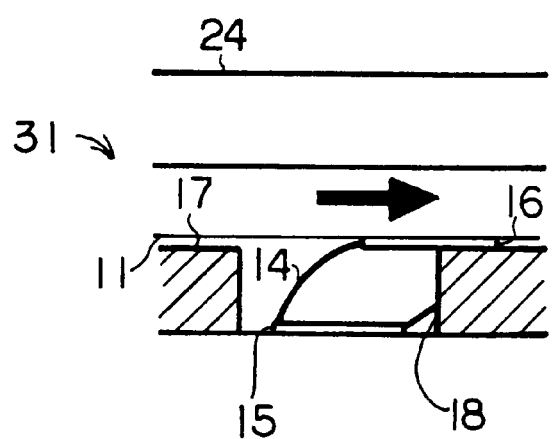
FIG. 11 is an enlarged partial sectional view of the MCM of the second embodiment for illustrating a method of detaching the MCU from the printed circuit board according to a specific example.
Figure 12:
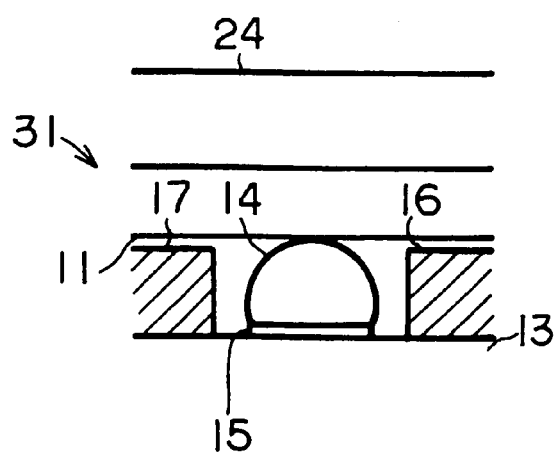
FIG. 12 is an enlarged partial sectional view of the MCM of the second embodiment for illustrating a subsequent method of detaching the MCU from the printed circuit board according to the specific example.

When the MCU 11 is to be detached from the printed circuit board 13 in the MCM 31, the inner wall of the through hole 18 may be displaced along the surface of the terminal pad 16 while the solder bump 14 is kept at a melting temperature, for example. As shown in FIG. 11, the sliding movement of the MCU 11 along the stationary insulated film 17, keeping contact of the heat block 24 with the MCU 11, serves to hinder the terminal pad 16 on the MCU 11 from dragging the melting solder bump 14. As a result, the solder bump 14 is torn off from the terminal pad 16 of the MCU 11 as shown in FIG. 12. After the MCU 11 has been detached from the printed circuit board 13, the solder bump 14 hardly remains on the terminal pad 16 on the MCU 11. Accordingly, the MCU 11 can easily be reused without additional operation for removing the solder bump 14 from the terminal pad 16. In particular, such method is most useful when an electronic component is to be detached in a semiconductor package. Such a semiconductor package in general employs a single bare chip, more expensive than the printed circuit board 13 or the remaining electronic components on the printed circuit board 13.

Figure 13:
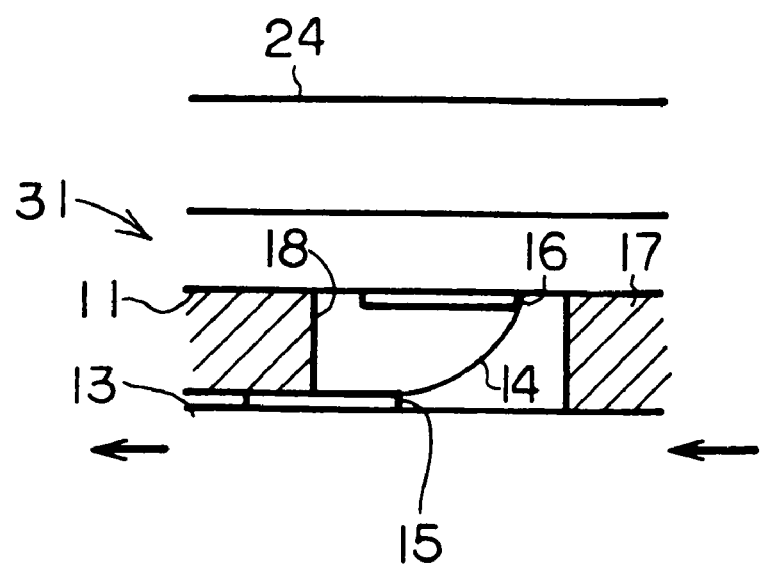
FIG. 13 is an enlarged partial sectional view of the MCM of the second embodiment for illustrating a method of detaching the MCU from the printed circuit board according to another specific example.
Figure 14:
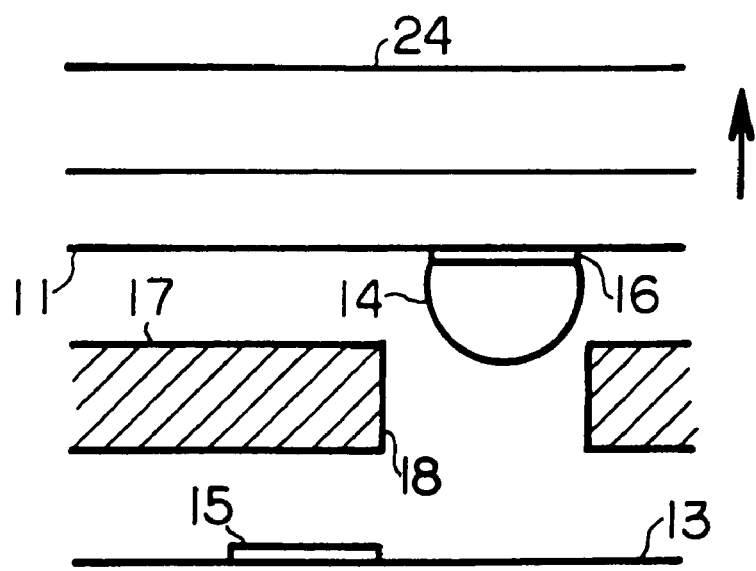
FIG. 14 is an enlarged partial sectional view of the MCM of the second embodiment for illustrating a subsequent method of detaching the MCU from the printed circuit board according to the another specific example.
Figure 15:
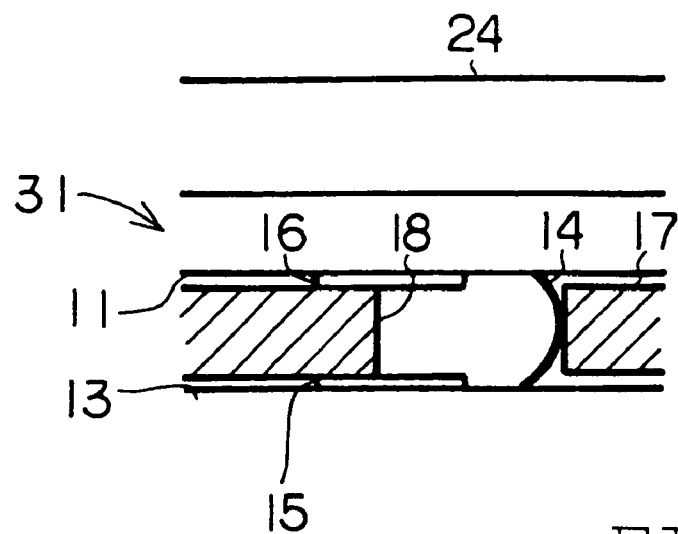
FIG. 15 is an enlarged partial sectional view of the MCM of the second embodiment for illustrating a method of detaching the MCU from the printed circuit board according to a further specific example.
Figure 16:
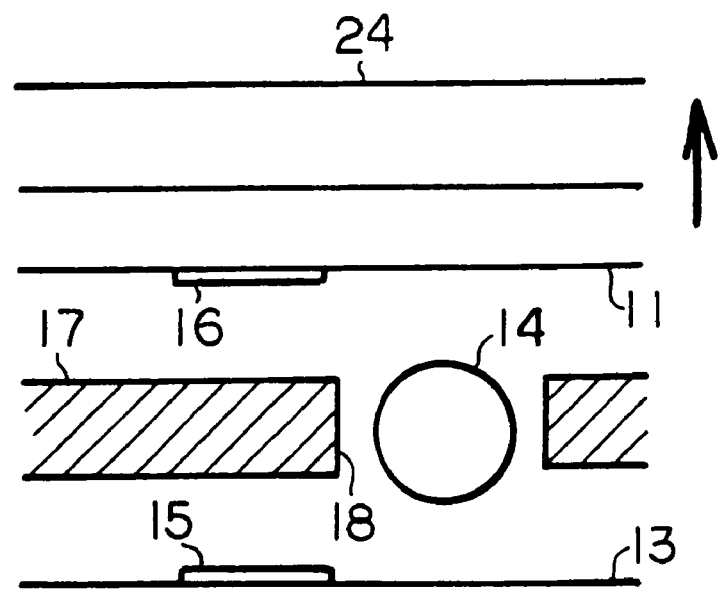
FIG. 16 is an enlarged partial sectional view of the MCM of the second embodiment for illustrating a subsequent method of detaching the MCU from the printed circuit board according to the further specific example.
Figure 17:
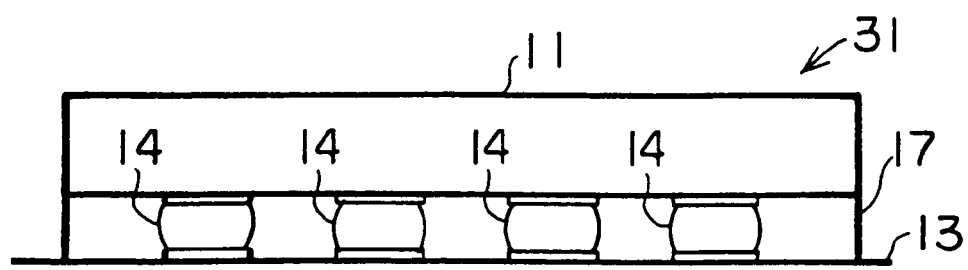
FIG. 17 is an enlarged sectional view of the MCM for schematically illustrating an insulated film as a seal member for the solder bumps.

On the other hand, the printed circuit board 13 may be slid along the insulated film 17, for example, so as to achieve the displacement of the through hole 18 relative to the surface of the input/output pad 15, as shown in FIG. 13, while the heat block 24 is maintained on the stationary MCU 11. In this case, the inner wall of the through hole 18 serves to hinder the input/output pad 15 on the printed circuit board 13 from dragging the melting solder bump 14. As a result, the solder bump 14 is torn off from the input/output pad 15 of the printed circuit board 13, as shown in FIG. 14. After the MCU 11 has been detached from the printed circuit board 13, the solder bump 14 hardly remains on the input/output pad 15 on the printed circuit board 13. Accordingly, the printed circuit board 13 can easily be reused without additional operation for removing the solder bump 14 from the input/output pad 15. In addition, if the insulated film 17 is slid simultaneously relative to the MCU 11 and the printed circuit board 13, as shown in FIGS. 15 and 16, the solder bump 14 can be wiped out from the terminal pad 16 on the MCU 11 and the input/output pad 15 on the printed circuit board 13, respectively. It should be noted that the insulated film 17 employed in the above-described MCM 31 may be utilized as a sealing member for the solder bumps 14, as shown in FIG. 17.

Figure 18:
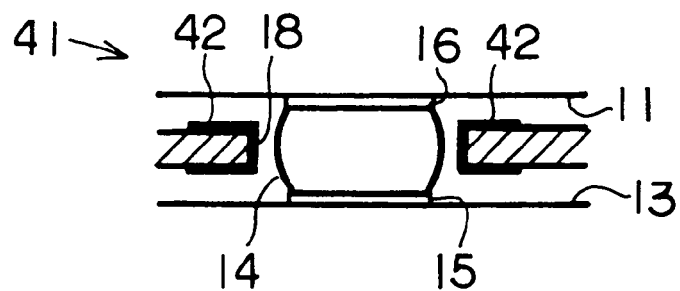
FIG. 18 is an enlarged sectional view schematically illustrating a part of an MCM according to a third embodiment of the present invention.

FIG. 18 illustrates a part of an MCM 41 according to a third embodiment of the present invention. In this embodiment, the inner surface of the through hole 18 is covered with a coating 42 which having a higher wetness to the solder bump 14. Note that the like reference numerals are attached to structure or components achieving the function or advantages identical to those in the above-described first and second embodiments.

Figure 19:
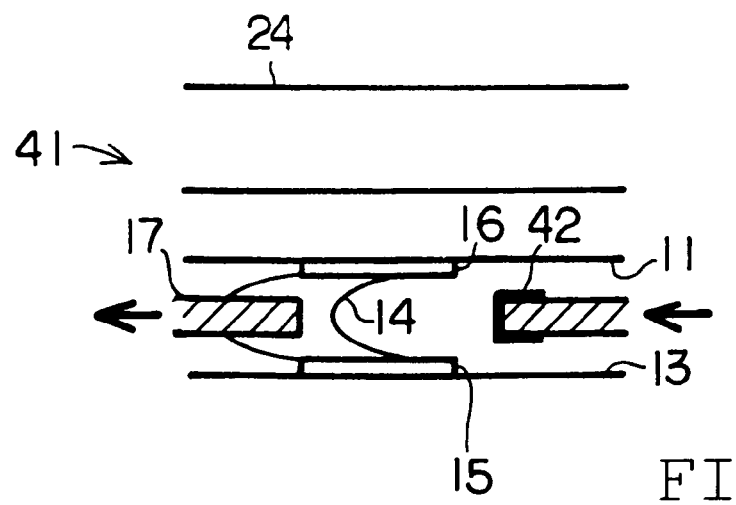
FIG. 19 is an enlarged partial sectional view of the MCM of the third embodiment for illustrating a method of detaching the MCU from the printed circuit board according to a specific example.

When the MCU 11 is to be detached from the printed circuit board 13 in the MCM 41, the inner wall of the through hole 18 may be displaced along the surface of the input/output pad 15 while the solder bump 14 is kept at a melting temperature, for example. In this case, the insulated film 17 may, not only contact the terminal pad 16 on the MCU 11 and the input/output pad 15 on the printed circuit board 13, but also keep spaced from the terminal and the input/output pad 16, 15. As shown in FIG. 19, when the insulated film 17 is moved relative to the stationary MCU 11 and printed circuit board 13 in the horizontal direction, for example, keeping contact of the heat block 24 with the MCU 11, the coating 42 serves to drag the melting solder bump 14. The solder bump 14 is torn off simultaneously from the terminal pad 16 of the MCU 11 and the input/output pad 15 on the printed circuit board 13.

Figure 20:
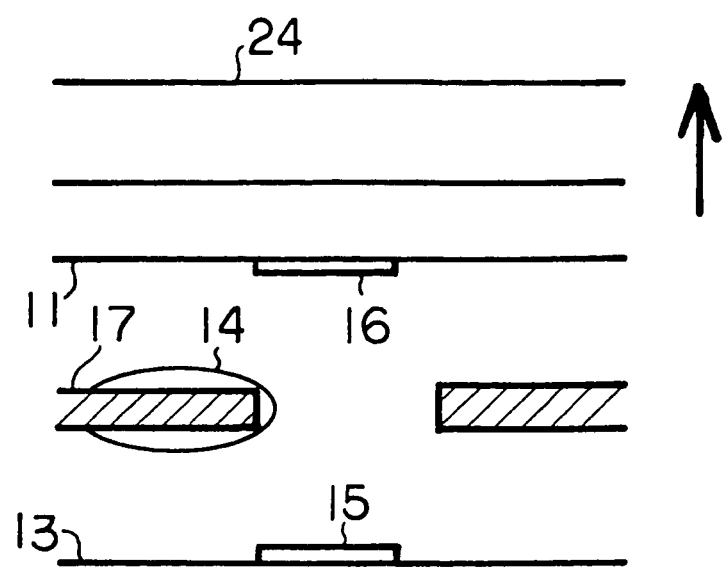
FIG. 20 is an enlarged partial sectional view of the MCM of the third embodiment for illustrating a subsequent method of detaching the. MCU from the printed circuit board according to the specific example.

Moreover, since the solder bump 14 is expected to held on the insulated film 17, as shown in FIG. 20, the solder bump 14 can easily be collected.

It should be noted that the present invention can be applied not only to the above-described MCMs 10, 31, 41 but also to any type of printed circuit board unit such as a motherboard comprising MCMs and other electronic components mounted on a printed circuit board. Heat air may be employed to allow solder bumps to melt between the MCMs and other electronic components and the printed circuit board of a larger size, for example, as is conventionally known. Moreover, the present invention may be applied not only to a ball grid array (BGA) such as the aforementioned MCMs 10, 31, 41 but also to any type of solder bonding such as a pin grid array (PGA), a lead frame, and the like.

What is claimed is:

1. A method of detaching an electronic component from a printed circuit board, comprising:
   heating a solder bump to a melting temperature between the electronic component and the printed circuit board, said solder bump having a constriction standing on a surface of a conductive pad on the printed circuit board;
   holding an insulated film superposed on the conductive pad, the insulated film defining a through hole receiving the solder bump inside to form the constriction in the solder bump;
   sliding the insulated film along the conductive pad so as to wipe the solder bump from the conductive pad when the solder bump is kept at the melting temperature; and
   lifting up the electronic component from the printed circuit board along with the solder bump after the insulated film has been slid.

2. A method of detaching an electronic component from a printed circuit board, comprising:
   heating a solder bump to a melting temperature between the electronic component and the printed circuit board, said solder bump having a constriction standing on a surface of a conductive pad on the printed circuit board, an insulated film located between the electronic component and the printed circuit board for defining a through hole designed to form the constriction in the solder bump;
   lifting the electronic component away from the printed circuit board and the insulated film to tear the solder bump into two pieces, when the solder bump is kept melted, one of the two pieces being attached to the electronic component, other of the two pieces remaining on the conductive pad inside the through hole and on the insulated film; and
   lifting up the insulated film away from the conductive pad, after the other of the two pieces gets hardened, so as to tear the constriction into two pieces, one of the two pieces remaining on the conductive pad while other of the two pieces kept on the insulated film.

* * * * *